(12) United States Patent
Kim et al.

(10) Patent No.: US 12,382,790 B2
(45) Date of Patent: Aug. 5, 2025

(54) LIGHT EMITTING DISPLAY APPARATUS

(71) Applicant: LG Display Co., Ltd., Seoul (KR)

(72) Inventors: YongCheol Kim, Goyang-si (KR); Jaeho Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 603 days.

(21) Appl. No.: 17/532,680

(22) Filed: Nov. 22, 2021

(65) Prior Publication Data
US 2022/0209198 A1   Jun. 30, 2022

(30) Foreign Application Priority Data
Dec. 30, 2020   (KR) .................. 10-2020-0188486

(51) Int. Cl.
| | |
|---|---|
| *H10K 59/124* | (2023.01) |
| *H10K 50/84* | (2023.01) |
| *H10K 50/858* | (2023.01) |
| *H10K 59/122* | (2023.01) |
| *H10K 59/80* | (2023.01) |

(52) U.S. Cl.
CPC ......... *H10K 59/124* (2023.02); *H10K 50/841* (2023.02); *H10K 50/858* (2023.02); *H10K 59/122* (2023.02); *H10K 59/8722* (2023.02); *H10K 59/878* (2023.02); *H10K 59/879* (2023.02); *H10K 59/876* (2023.02)

(58) Field of Classification Search
CPC .. H10K 59/124; H10K 50/841; H10K 59/122; H10K 59/8722
See application file for complete search history.

(56) References Cited

U.S. PATENT DOCUMENTS

| | | | |
|---|---|---|---|
| 9,306,188 B2 * | 4/2016 | Kim | H10K 59/126 |
| 9,536,931 B2 | 1/2017 | Kim et al. | |
| 10,230,066 B2 | 3/2019 | Paek et al. | |
| 10,756,149 B2 | 8/2020 | Lee et al. | |
| 2013/0187163 A1 | 7/2013 | Kim et al. | |
| 2014/0312319 A1 * | 10/2014 | Kim | H10D 86/451 |
| | | | 257/40 |
| 2014/0353595 A1 * | 12/2014 | Choi | H10K 59/00 |
| | | | 257/40 |
| 2014/0361253 A1 | 12/2014 | Choi et al. | |
| 2014/0362126 A1 * | 12/2014 | Jeong | G09G 3/03 |
| | | | 345/76 |
| 2016/0226013 A1 * | 8/2016 | Liu | H10K 59/80515 |
| 2017/0155094 A1 * | 6/2017 | Joung | H10K 59/124 |
| 2017/0262109 A1 * | 9/2017 | Choi | H10K 59/1315 |

(Continued)

FOREIGN PATENT DOCUMENTS

| | | |
|---|---|---|
| CN | 110010646 A | 7/2019 |
| CN | 110473881 A | 11/2019 |

(Continued)

*Primary Examiner* — Bac H Au
(74) *Attorney, Agent, or Firm* — Birch, Stewart, Kolasch & Birch, LLP (57) ABSTRACT

According to the present disclosure, the light distribution of a light emitting display apparatus is effectively controlled by asymmetrically disposing a protruding portion of a curved surface area of the light emitting display apparatus to minimize a degradation of a luminance in the curved surface area and a difference in a color sense between a flat surface area and the curved surface area of the light emitting display apparatus.

12 Claims, 7 Drawing Sheets

(56) References Cited

U.S. PATENT DOCUMENTS

| | | | |
|---|---|---|---|
| 2017/0287997 A1* | 10/2017 | Park | ..................... H10K 77/111 |
| 2019/0181365 A1* | 6/2019 | Choi | ..................... H10K 59/124 |
| 2020/0035760 A1 | 1/2020 | Park et al. | |
| 2020/0194713 A1 | 6/2020 | Kim et al. | |
| 2022/0085327 A1* | 3/2022 | Kim | ..................... H10K 50/844 |

FOREIGN PATENT DOCUMENTS

| | | |
|---|---|---|
| CN | 111384297 A | 7/2020 |
| KR | 10-2013-0085195 A | 7/2013 |
| KR | 10-2014-0143636 A | 12/2014 |
| KR | 10-2018-0003368 A | 1/2018 |
| KR | 10-2019-0073732 A | 6/2019 |
| KR | 10-2019-0074874 A | 6/2019 |
| KR | 10-2020-0013499 A | 2/2020 |
| KR | 10-2075728 B1 | 2/2020 |
| KR | 10-2020-0134752 A | 12/2020 |

\* cited by examiner

LIGHT EMITTING DISPLAY APPARATUS

CROSS-REFERENCE TO RELATED APPLICATIONS

This application claims priority to Korean Patent Application No. 10-2020-0188486 filed on Dec. 30, 2020, in the Korean Intellectual Property Office, the entire contents of which are hereby expressly incorporated by reference into the present application.

BACKGROUND

Field

The present disclosure relates to a light emitting display apparatus, and more particularly, to a light emitting display apparatus which is capable of adjusting a light distribution.

Description of the Related Art

In a current full-scale information era, a display field for visually displaying information and data has been rapidly developed. In this effort, a study of improving the performance of various display apparatuses is continuing so as to obtain an improved display device with a thin-thickness, a light weight, and a low power consumption.

Among the various display apparatuses, a light emitting display apparatus is a self-emitting display apparatus that does not need a separate light source, which is different from a liquid crystal display apparatus that needs a backlight unit as a separate light source. An example of the light emitting display apparatus can be an OLED display.

As a result, the light emitting display apparatus can be manufactured to have a light weight and a small thickness. Further, since the light emitting display apparatus is driven at a low voltage, it is advantageous not only in terms of power consumption, but also in terms of color implementation, response speed, viewing angle, and contrast ratio (CR). Therefore, the light emitting display apparatus is being utilized widely in various fields.

SUMMARY OF THE DISCLOSURE

An object to be achieved by the present disclosure is to provide a display apparatus in which a protruding portion of an over coating layer disposed in a curved surface area is asymmetrically disposed to control a light distribution in the curved surface area to a side surface direction.

Another object to be achieved by the present disclosure is to provide a display apparatus which improves the degradation of a luminance in the curved surface area and a difference in color sense between a flat surface area and a curved surface area.

Objects of the present disclosure are not limited to the above-mentioned objects, and other objects, which are not mentioned above, can be clearly understood by those skilled in the art from the following descriptions.

According to an aspect of the present disclosure, a light emitting display apparatus includes a cover member including a flat surface area and a curved surface area, and a display panel disposed below the cover member. The display panel can include a substrate in which a plurality of sub pixels is disposed; an over coating layer which is disposed on the substrate and includes a base portion and a protruding portion protruding from the base portion; a plurality of first electrodes disposed to cover a side portion of the protruding portion and the base portion; a bank layer which is disposed on some of the plurality of first electrodes in a non-emission area to define an emission area and the non-emission area of the plurality of sub pixels; a light emitting layer disposed on the plurality of first electrodes and the bank layer; and a second electrode disposed on the light emitting layer. The plurality of sub pixels can include a first sub pixel disposed in the flat surface area and a second sub pixel disposed in the curved surface area, and the protruding portion is disposed on one side farther from the flat surface area between both sides of the emission area of the second sub pixel.

According to another aspect of the present disclosure, a light emitting display apparatus includes a cover member including a flat surface area and a curved surface area, and a display panel which is disposed below the cover member and has a flat structure. The display panel can include a substrate in which a plurality of sub pixels including an emission area and a non-emission area is disposed; an over coating layer which is disposed on the substrate and includes a base portion and a protruding portion; a plurality of light emitting diodes which is disposed in each of the plurality of sub pixels on the over coating layer and includes a first electrode, a light emitting layer, and a second electrode, wherein protruding portions disposed in the plurality of sub pixels corresponding to the flat surface area among the plurality of sub pixels are disposed on both sides of the emission area with the same height, a protruding portion disposed in the plurality of sub pixels corresponding to the curved surface area, among the plurality of sub pixels, includes a first protruding portion which is disposed on one side farther from the flat surface area between both sides of the emission area to adjust a light distribution in the curved surface area; and a second protruding portion which has a lower height than the first protruding portion and is disposed on the other side of the emission area.

Other detailed matters of the exemplary embodiments are included in the detailed description and the drawings.

According to the present disclosure, the light distribution of the light emitting display apparatus is controlled by asymmetrically disposing the protruding portion of the curved surface area to improve the degradation of the luminance in the curved surface area and a difference in a color sense between the flat surface area and the curved surface area.

According to the present disclosure, a path of the light emitted from a light emitting layer of a sub pixel corresponding to a curved surface area is changed to increase a light extraction efficiency.

According to the present disclosure, a light emitting display apparatus with improved power consumption can be implemented by improving the light extraction efficiency.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Advantages and characteristics of the present disclosure and the methods of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification.

Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "over", "below", "under" and "next", one or more parts can be positioned between the two parts unless the terms are used with the term "immediately" or "directly".

When an element or layer is disposed "on" another element or layer, another layer or another element (or multiple layers/elements) can be interposed directly on the other element or therebetween.

Although the terms "first", "second", and the like are used for describing various components, these components are not confined by these terms. These terms are merely used for distinguishing one component from the other components and may not define order or sequence. Therefore, a first component to be mentioned below can be a second component in a technical concept of the present disclosure.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light emitting display apparatus according to exemplary embodiments of the present disclosure will be described in detail with reference to accompanying drawings. All components of each light emitting display apparatus according to all embodiments of the present disclosure are operatively coupled and configured.

Figure 1:
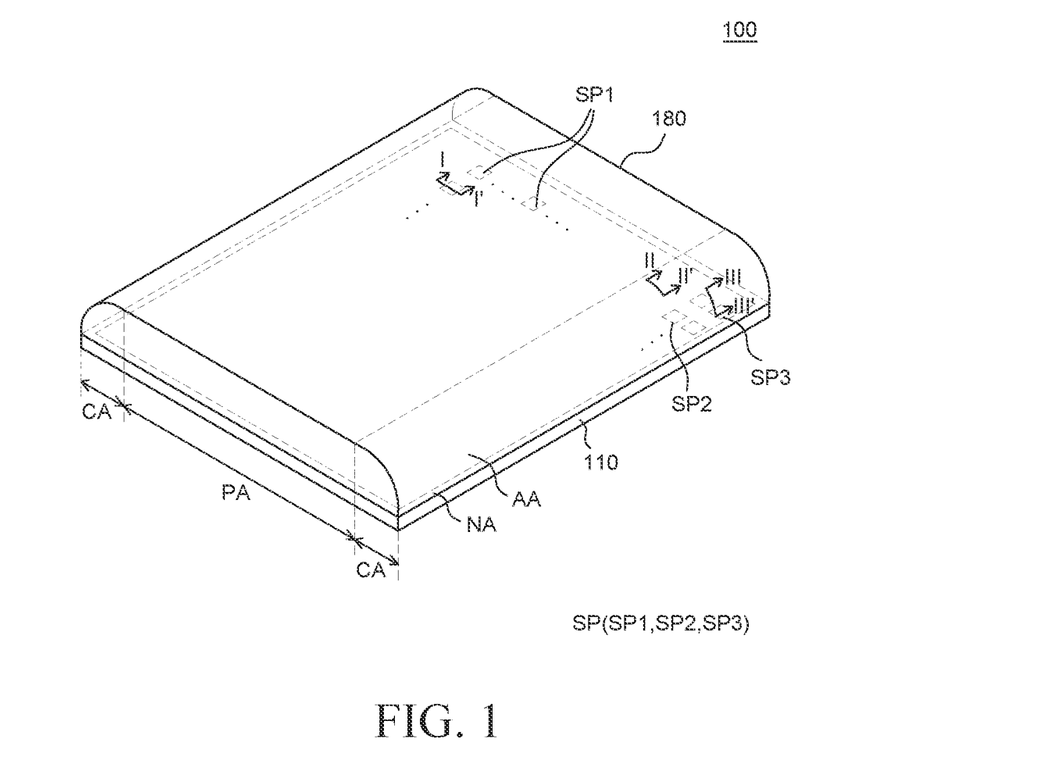
FIG. 1 is a perspective view of a light emitting display apparatus according to an exemplary embodiment of the present disclosure.
Figure 2:
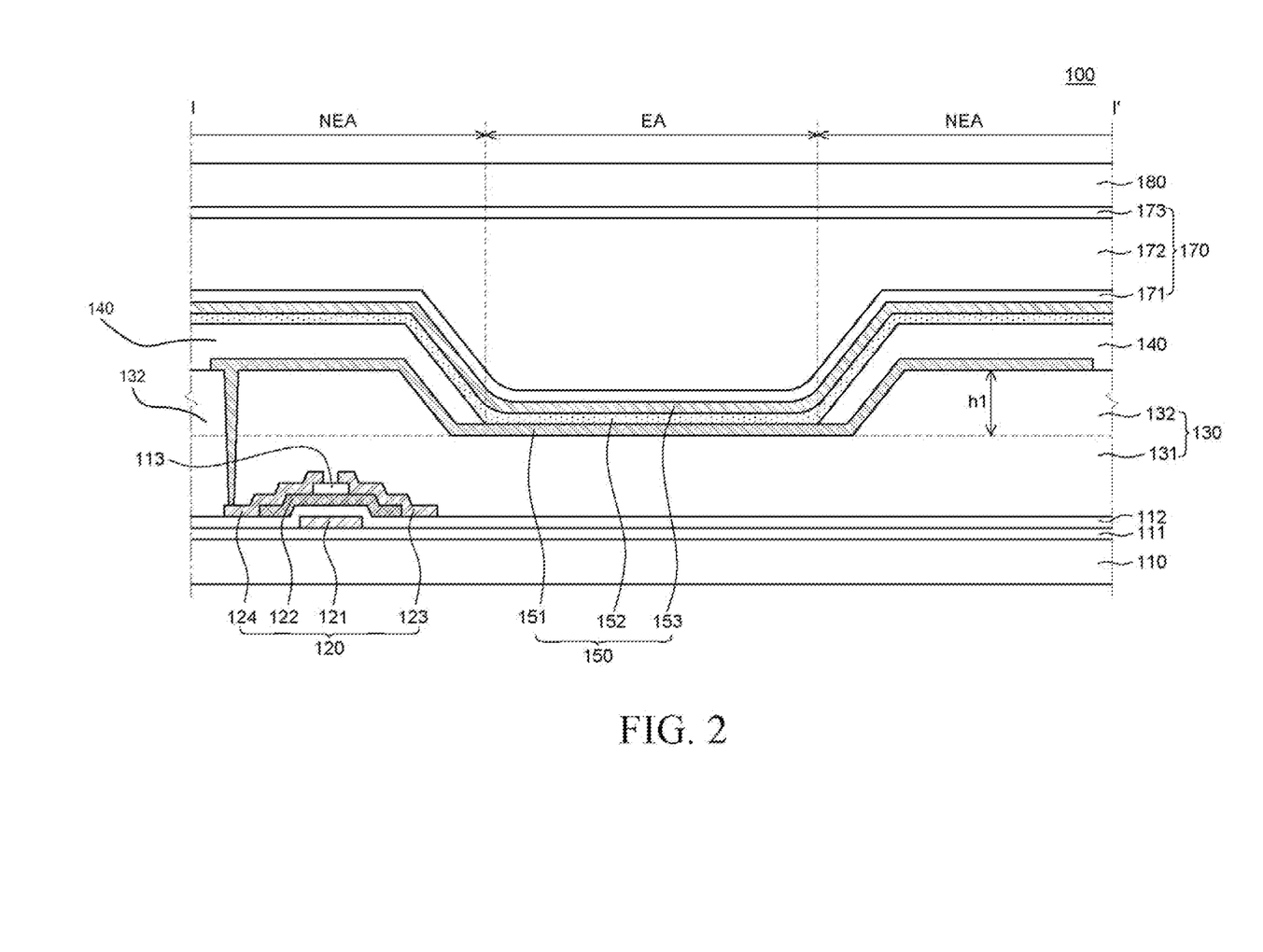
FIG. 2 is a cross-sectional view of the light emitting display apparatus taken along the line I-I' of FIG. 1.

FIG. 1 is a perspective view of a light emitting display apparatus according to an exemplary embodiment of the present disclosure. FIG. 2 is a cross-sectional view of the light emitting display apparatus taken along the line I-I' of FIG. 1.

Referring to FIGS. 1 and 2, a light emitting display apparatus 100 can include a substrate 110, a thin film transistor (TFT) 120, an over coating layer 130, a bank layer 140, a light emitting diode 150, an encapsulation unit 170, and a cover member 180. A portion from the substrate 110 to the encapsulation unit 170 can be referred to as a display panel. The light emitting display apparatus 100 is implemented as a top emission type light emitting display apparatus, but can be of other types. In FIG. 1, for the convenience of description, among the various components of the display apparatus 100, the substrate 110 and the cover member 180 are illustrated while other components may not be shown expressly.

Referring to FIGS. 1 and 2 together, the cover member 180 is disposed on the display panel which can include the substrate 110, the thin film transistor 120, the over coating layer 130, the bank layer 140, the light emitting diode 150, and the encapsulation unit 170. The cover member 180 protects the display panel from an external impact and suppresses deterioration of the display panel by outside air such as moisture or oxygen. The cover member 180 can be formed of a tempered glass having a high light transmittance and excellent impact resistance.

The cover member 180 includes a flat surface area PA and a curved surface area CA. The flat surface area PA is an area in which both an upper surface and a lower surface of the cover member 180 are formed by flat surfaces. The curved surface area CA is an area in which a lower surface is formed by a flat surface and an upper surface is formed by a curved surface. For example, the lower surface of the cover member 180 is formed by a flat surface in both the flat surface area PA and the curved surface area CA. On the other hand, a part of the upper surface of the cover member 180 is formed by the flat upper surface of the flat surface area PA, whereas an edge portion of the upper surface of the cover member 180 is formed by a curved surface. In one example, the curved surface area CA is disposed on both sides or two opposite sides of the flat surface area PA so that the slope of the curved surface area CA is increased as it moves further from the flat surface area PA.

However, the present disclosure is not limited thereto and the curved surface areas CA disposed on both sides of the flat surface area PA can be disposed with different radii of curvature. Further, the curved surface area CA can be disposed on only one side of the flat surface area PA or disposed in all sides or some sides of the flat surface area PA. For example, when the flat surface area PA has four sides, the curved surface area CA can be disposed on one or more sides of the four sides of the flat surface area, or can be disposed on all four sides of the flat surface area PA. Further, depending on the shape of the flat surface area PA, the location and configuration of the curve surface area CA can vary accordingly.

The cover member 180 can be adhered onto the display panel by means of an adhesive member. For example, the adhesive member can be disposed between the cover member 180 and the encapsulation unit 170. For example, the cover member 180 can be adhered onto the display panel by means of the adhesive member such as an optical clear adhesive (OCA), an optical clear resin (OCR), or a pressure sensitive adhesive (PSA), but is not limited thereto.

For example, the cover member 180 including the flat surface area PA and the curved surface area CA can be formed on an edge portion with a radius of curvature by mounting a flat tempered glass substrate in a molding frame and heating. Further, the cover member can be formed to have a radius of curvature by grinding both edges of the upper surface of the flat tempered glass substrate, but is not limited thereto.

Referring to FIGS. 1 and 2 together, the substrate 110 can support and protect one or more components of the light emitting display apparatus 100. The substrate 110 can be formed of a glass or a plastic material having flexibility. When the substrate 110 is formed of a plastic material, for example, the substrate can be formed of polyimide (PI), but it is not limited thereto.

The substrate 110 can include a display area AA and a non-display area NA. The display area AA is an area in which an image is displayed in the light emitting display apparatus 100 and a display element and various driving elements for driving the display element are disposed in the display area AA. For example, the display element can be configured by the light emitting diode 150 including a first electrode 151, a light emitting layer 152, and a second electrode 153. Further, various driving elements (e.g., driving circuit) for driving the display element, such as the thin film transistor 120, a capacitor, or a wiring line can be disposed in the display area AA.

A plurality of sub pixels SP can be included in the display area AA. The sub pixel SP is a minimum unit which configures a screen and each of the plurality of sub pixels SP can include the light emitting diode 150 and a driving circuit for driving the light emitting diode 150.

Further, the plurality of sub pixels SP can emit light having different wavelengths. For example, the plurality of sub pixels SP can include at least one red sub pixel, a green sub pixel, and a blue sub pixel. But it is not limited thereto and the plurality of sub pixels SP can further include a white sub pixel.

Referring to the example of FIG. 1, the plurality of sub pixels SP can include a first sub pixel SP1, a second sub pixel SP2, and a third sub pixel SP3. The first sub pixel SP1 is a sub pixel which is disposed in the display area AA corresponding to the flat surface area PA of the cover member 180. The second sub pixel SP2 and the third sub pixel SP3 are sub pixels which are disposed in the display area AA corresponding to the curved surface area CA of the cover member 180. For example, the first sub pixel SP1 can be disposed on a portion of the substrate 110 corresponding to the flat surface area PA of the cover member 180, while the second sub pixel SP2 and the third sub pixel SP3 can be disposed on portions of the substrate 110 corresponding to the curved surface area CA of the cover member 180.

Further, it is assumed that the third sub pixel SP3 is a pixel farther from the flat surface area PA than the second sub pixel SP2. The first sub pixel SP1 to third sub pixel SP3 will be described below in detail with reference to FIGS. 2 to 4.

The driving circuit of each sub pixel SP is a circuit for controlling the driving of the corresponding light emitting diode 150. For example, the driving circuit can be configured to include the thin film transistor 120 and the capacitor, but is not limited thereto.

The non-display area NA is an area where no image is displayed and various components for driving the plurality of sub pixels SP disposed in the display area AA can be disposed in the non-display area NA. For example, a driving IC which supplies a signal for driving the plurality of sub pixels SP and a flexible film can be disposed in the non-display area NA.

The non-display area NA can be an area which encloses the display area AA as illustrated in FIG. 1, but is not limited thereto. For example, the non-display area NA can be an area extending from the display area AA and can be on one or more sides of the display area AA.

The first sub pixel SP1 disposed on the portion of the substrate 110 corresponding to the flat surface area PA of the cover member 180 will be described with reference to FIG. 2.

Referring to FIG. 2, a buffer layer 111 is disposed on the substrate 110. The buffer layer 111 can improve adhesiveness between layers formed on the buffer layer 111 and the substrate 110 and block alkali components leaked from the substrate 110. The buffer layer 111 can be formed of a single layer of silicon nitride (SiNx) or silicon oxide (SiOx) or a multiple layer of silicon nitride (SiNx) and silicon oxide (SiOx), but is not limited thereto. The buffer layer 111 can be omitted based on a type and/or a material of the substrate 110 and/or a structure and/or a type of the thin film transistor 120.

The thin film transistor 120 is disposed on the substrate 110. The thin film transistor 120 can be used as a driving element of the light emitting display apparatus 100. The thin film transistor 120 includes a gate electrode 121, an active layer 122, a source electrode 123, and a drain electrode 124. In the light emitting display apparatus 100 according to the exemplary embodiment of the present disclosure, the thin film transistor 120 has a structure in which the active layer 122 is disposed on the gate electrode 121, and the source electrode 123 and the drain electrode 124 are disposed on the active layer 122. Therefore, the thin film transistor 120 has a bottom gate structure in which the gate electrode 121 is disposed in the lowermost portion, but it is not limited thereto.

The gate electrode 121 of the thin film transistor 120 is disposed on the substrate 110. The gate electrode 121 can be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

A gate insulating layer 112 is disposed on the gate electrode 121 and the buffer layer 111. The gate insulating layer 112 is a layer for electrically insulating the gate electrode 121 from the active layer 122 and can be formed of an insulating material. For example, the gate insulating layer 112 can be formed as a single layer of silicon nitride (SiNx) or silicon oxide (SiOx) which is an inorganic material or a multiple layer of silicon nitride (SiNx) or silicon oxide (SiOx), but it is not limited thereto.

The active layer 122 is disposed on the gate insulating layer 112. The active layer 122 is disposed so as to overlap the gate electrode 121. For example, the active layer 122 can be formed of an oxide semiconductor, amorphous silicon (a-Si), polycrystalline silicon (poly-Si), an organic semiconductor, or the like.

An etch stopper 113 is disposed on the active layer 122. When the source electrode 123 and the drain electrode 124 are patterned using an etching method, a damage of the surface of the active layer 122 due to plasma can be suppressed by the etch stopper 113. One side of the etch stopper 113 overlaps the source electrode 123 and the other side of the etch stopper 113 can overlap the drain electrode 124. However, the etch stopper 113 can be omitted or can have a different configuration.

The source electrode 123 and the drain electrode 124 are disposed on the active layer 122 and the etch stopper 113. The source electrode 123 and the drain electrode 124 are disposed on a same layer to be spaced apart from each other. The source electrode 123 and the drain electrode 124 can be in contact with the active layer 122 to be electrically connected to the active layer 122. The source electrode 123 and the drain electrode 124 can be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The over coating layer 130 is formed on the thin film transistor 120. The over coating layer 130 protects the thin film transistor 120 and makes the step of layers disposed on the substrate 110 gentle or minimal. The over coating layer 130 can be formed of one of acrylic resin, epoxy resin, phenol resin, polyamide resin, polyimide resin, unsaturated polyester resin, polyphenylene resin, polyphenylene sulfide resin, benzocyclobutene, and photoresist, but is not limited thereto.

The over coating layer 130 can include a base portion 131 and a protruding portion 132. As illustrated in FIG. 2, the base portion 131 and the protruding portion 132 can be integrally formed. For example, the base portion 131 and the protruding portion 132 are formed of the same material to be simultaneously formed by the same process, for example, by a mask process, but are not limited thereto.

The base portion 131 of the over coating layer 130 is disposed on the thin film transistor 120 and the gate insulating layer 112. An upper surface of the base portion 131 has a surface parallel to the substrate 110. Therefore, the base portion 131 protects the thin film transistor 120 and planarizes the step of the layers disposed on the substrate 110.

The protruding portion 132 of the over coating layer 130 is disposed on the base portion 131. The protruding portion 132 is integrally formed with the base portion 131 to protrude from the base portion 131. Therefore, an upper surface of the protruding portion 132 can be formed to be smaller than a bottom surface, but it is not limited thereto.

In the first sub pixel SP1, the protruding portions 132 can be disposed on both sides of an emission area EA with the same height. In this case, the light emitted from the light emitting layer 152 is distributed to be bilaterally symmetrical so that luminance in a front direction is excellent, and is emitted in the emission area EA of the display panel. As an example, a height h1 of the protruding portion 132 can be in the range of 1 µm to 10 µm, but is not limited thereto. Each protruding portion 132 can have the height h1.

Each protruding portion 132 has an upper surface and a side surface. The upper surface of the protruding portion 132 is a surface disposed on an uppermost portion of the protruding portion 132 and can be a surface parallel or substantially parallel to the base portion 131 or the substrate 110. The side surface of the protruding portion 132 can be a surface which connects the upper surface of the protruding portion 132 and the base portion 131. The side surface of the protruding portion 132 can be inclined toward the base portion 131 from the upper surface of the protruding portion 132.

Even though in FIG. 2, it is described that the over coating layer 130 includes the base portion 131 having a flat upper surface and the protruding portion 132 protruding from the base portion 131, it is not limited thereto. Further, the plurality of sub pixels SP disposed on the substrate 110 corresponding to the flat surface area PA may not include the protruding portion 132. In this case, the over coating layer 132 is formed of only the flat base portion 131 so that the first electrode 151 disposed thereabove can have a flat shape, rather than an inclined shape, e.g., the entire first electrode 151 in the emission area EA and non-emission areas NEA can be disposed flat having no step. For example, when light emitted from the light emitting layer 152 of the plurality of sub pixels SP disposed on the substrate 110 corresponding to the flat surface area PA, for example, the first sub pixel SP1, has a bilateral symmetrical light distribution, a detailed configuration of the over coating layer 130 can be changed in various forms.

Referring to FIG. 2, the light emitting diode 150 is disposed on the over coating layer 130. The light emitting diode 150 includes the first electrode 151 disposed on the over coating layer 130, the light emitting layer 152 disposed on the first electrode 151, and the second electrode 153 disposed on the light emitting layer 152.

The first electrode 151 is disposed on the over coating layer 130 to cover the base portion 131 and the side and upper portion of the protruding portion 132. For example, the first electrode 151 is disposed on the upper surface of the base portion 131 where the protruding portion 132 is not disposed, the side surface and a partial area of the upper surface of the protruding portion 132. The first electrode 151 can be disposed in accordance with the shape of the base portion 131 and the protruding portion 132. Therefore, the first electrode 151 can have a flat upper surface on the upper surface of the base portion 131 and the upper surface of the protruding portion 132 of the over coating layer 130, while having an inclined upper surface on the side surface of the protruding portion 132. The first electrode 151 can be formed to be separated for every sub pixel SP.

The first electrode 151 is configured by a reflective layer and a transparent conductive layer disposed on the reflective layer to be electrically connected to the thin film transistor 120 on the base portion 131 of the over coating layer 130. Since the light emitting display apparatus 100 according to this embodiment of the present disclosure is a top emission type light emitting display apparatus as an example, the reflective layer can upwardly reflect the light emitted from the light emitting diode 150.

The reflective layer can be formed of a metal material. For example, the reflective layer can be formed of a metal material such as aluminum (Al), silver (Ag), copper (Cu), and magnesium-silver alloy (Mg:Ag), but is not limited thereto. The reflective layer can be electrically connected to the drain electrode 124 through a contact hole formed in the over coating layer 130. But it is not limited thereto and the reflective layer can be electrically connected to the source electrode 123 through a contact hole formed in the over coating layer 130.

The transparent conductive layer of the first electrode 151 is disposed on the reflective layer to be electrically connected to the drain electrode 124 by means of the reflective layer. The transparent conductive layer can be formed of a conductive material having a high work function to supply holes to the light emitting layer 152. For example, the transparent conductive layer can be formed of transparent conductive oxide such as indium tin oxide (ITO), indium zinc oxide (IZO), indium tin zinc oxide (ITZO), zinc oxide (ZnO), and tin oxide (TO), but is not limited thereto.

Referring to FIG. 2, the bank layer 140 is disposed on the first electrode 151 and the over coating layer 130. The bank layer 140 can be disposed to cover a part of the first electrode 151 of the light emitting diode 150 to include the emission area EA and the non-emission area NEA. For example, the bank layer 140 can be disposed on a part of the first electrode 151 in the non-emission area NEA to include the emission area EA and the non-emission area NEA of the plurality of sub pixels SP. The two non-emission areas NEA are shown to be disposed on the opposite sides of the emission area EA in the example of FIG. 2, but the present disclosure is not limited thereto.

As an example, the bank layer 140 can be disposed between the first electrode 151 and the light emitting layer 152 in the non-emission area NEA to block the generation of the light in the non-emission area NEA. Further, the bank layer 140 is not disposed in the emission area EA so that the light emitting layer 152 is disposed on the first electrode 151 to generate the light in the light emitting layer 152.

The bank layer 140 can be formed of an organic material or an inorganic material. For example, if the bank layer 140 is formed of an organic material, the bank layer can be formed of polyimide, acryl, or benzocyclobutene resin. On other hand, if the bank layer 140 is formed of an inorganic material, the bank layer 140 can be formed of amorphous silicon, silicon oxide, silicon nitride, or silicon oxy nitride, but is not limited thereto.

The light emitting layer 152 is disposed on the first electrode 151 and the bank layer 140. For example, the light emitting layer 152 is disposed on the first electrode 151 in the emission area EA and is disposed on the bank layer 140 in the non-emission area NEA.

The light emitting layer 152 is a layer for emitting light having a specific color and includes at least one of a red light emitting layer, a green light emitting layer, a blue light emitting layer, and a white light emitting layer. Further, the light emitting layer 152 can further include various layers such as a hole transport layer, a hole injection layer, a hole blocking layer, an electron injection layer, an electron blocking layer, or an electron transport layer. The light emitting layer 152 can be an organic light emitting layer formed of an organic material, but is not limited thereto. For example, the light emitting layer 152 can be a quantum dot light emitting layer or a micro LED.

The light emitting layer 152 is disposed on the bank layer 140 in the non-emission area NEA so that the light emitting layer 152 can also be formed in accordance with a shape of the bank layer 140. Therefore, the light emitting layer 152 can have a flat upper surface on the upper surface of the first electrode 151 of the emission area EA and the upper surface of the bank layer 140 of the non-emission area NEA, and can have an inclined upper surface on the side inclined surface of the bank layer 140.

The second electrode 153 is disposed on the light emitting layer 152. The second electrode 153 supplies electrons to the light emitting layer 152. The second electrode 153 can be formed of transparent conductive oxide such as indium tin oxide (ITO), indium zinc oxide (IZO), indium tin zinc oxide (ITZO), zinc oxide (ZnO), and tin oxide (TO) or a ytterbium (Yb) alloy. Further, the second electrode 153 can be formed of a metal material such as silver (Ag), copper (Cu), or a magnesium-silver alloy (Mg:Ag) or a metal material having a very thin thickness. However, since the light emitting display apparatus 100 is a top emission type in this example, the second electrode 153 has a very thin thickness so that the refractive index of the second electrode 133 may not affect the traveling of the light.

As the second electrode 153 is disposed on the light emitting layer 152 in the non-emission area NEA, the second electrode 153 can also be disposed in accordance with the shape of the bank layer 140. Therefore, the second electrode 153 has a flat upper surface on the upper surface of the first electrode 151 of the emission area EA and the upper surface of the bank layer 140 of the non-emission area NEA, and has an inclined upper surface on the side inclined surface of the bank layer 140. For the convenience of the process, the second electrode 153 is not formed to be separated for every sub pixel SP, but can be formed as a continuous single layer.

Referring to FIG. 2, the encapsulation unit 170 is disposed on the light emitting diode 150. The encapsulation unit 170 can be disposed so as to cover the second electrode 153. The encapsulation unit 170 protects the light emitting layer 150 from moisture or oxygen permeating from the outside of the light emitting display apparatus 100. Further, the encapsulation unit 170 can planarize the step by the light emitting diode 150.

The encapsulation unit 170 can include a first encapsulation layer 171, a second encapsulation layer 172, and a third encapsulation layer 173.

The first encapsulation layer 171 is disposed on the second electrode 153 to suppress or eliminate a permeation of the moisture or oxygen. The first encapsulating layer 171 can be formed of an inorganic material such as silicon nitride (SiNx), silicon oxy nitride (SiNxOy), or aluminum oxide (AlyOz), but is not limited thereto.

The first encapsulation layer 171 is disposed on the second electrode 153 so that the first encapsulation layer 171 is also disposed in accordance with the shape of the second electrode 153. Therefore, the first encapsulation layer 171 can have a flat upper surface on the upper surface of the first electrode 151 of the emission area EA and the upper surface of the bank layer 140 of the non-emission area NEA, and can have an inclined upper surface on the side inclined surface of the bank layer 140.

The second encapsulation layer 172 is disposed on the first encapsulation layer 171 to planarize the top surface of the structure formed therebelow. Further, the second encapsulation layer 172 can cover foreign materials or particles which can be generated during a manufacturing process. The second encapsulation layer 172 can be formed of an organic material, such as silicon oxy carbon (SiOxCz), acryl or epoxy resin, but is not limited thereto.

The third encapsulating layer 173 is disposed on the second encapsulation layer 172 and suppresses a permeation of the moisture or oxygen, like the first encapsulation layer 171. The third encapsulating layer 173 can be formed of an inorganic material such as silicon nitride (SiNx), silicon oxy nitride (SiNxOy), silicon oxide (SiOx), or aluminum oxide (AlyOz), but is not limited thereto. The third encapsulation layer 173 can be formed of the same material as the first encapsulation layer 171 or formed of a different material from the first encapsulation layer 171. As a variation, the third encapsulation layer 173 may be omitted or additional encapsulation layer(s) may be disposed on the third encapsulation layer 173.

The light emitting display apparatus 100 according to the exemplary embodiment of the present disclosure is a top emission type light emitting display apparatus so that the light emitting display apparatus 100 can be manufactured so as to implement micro cavity. Specifically, even though the second electrode 153 has a transmissive characteristic, some of the light emitted from the light emitting layer 152 can be reflected from the second electrode 153 having a transmissive characteristic to be directed to the first electrode 151. The light is reflected from the reflective layer of the first electrode 151 again so that light which is repeatedly reflected between the reflective layer and the second electrode 153 can be generated. At this time, it is possible to implement a micro cavity in which a luminance of light having a specific wavelength, among light emitted from the light emitting layer 152, can be improved by constructive interference based on a distance between layers from which the light is repeatedly reflected. Accordingly, in the light emitting display apparatus 100 according to the exemplary embodiment of the present disclosure, a distance between the reflective layer of the first electrode 151 and the second electrode 153 is set to implement the constructive interference for light emitted from the light emitting layer 152. Therefore, the optical efficiency can be improved.

Hereinafter, the second sub pixel SP2 disposed on a portion of the substrate 110, which corresponds to the curved surface area CA of the cover member 180 in FIG. 2, will be described in more detail with reference to FIG. 3 together.

Figure 3:
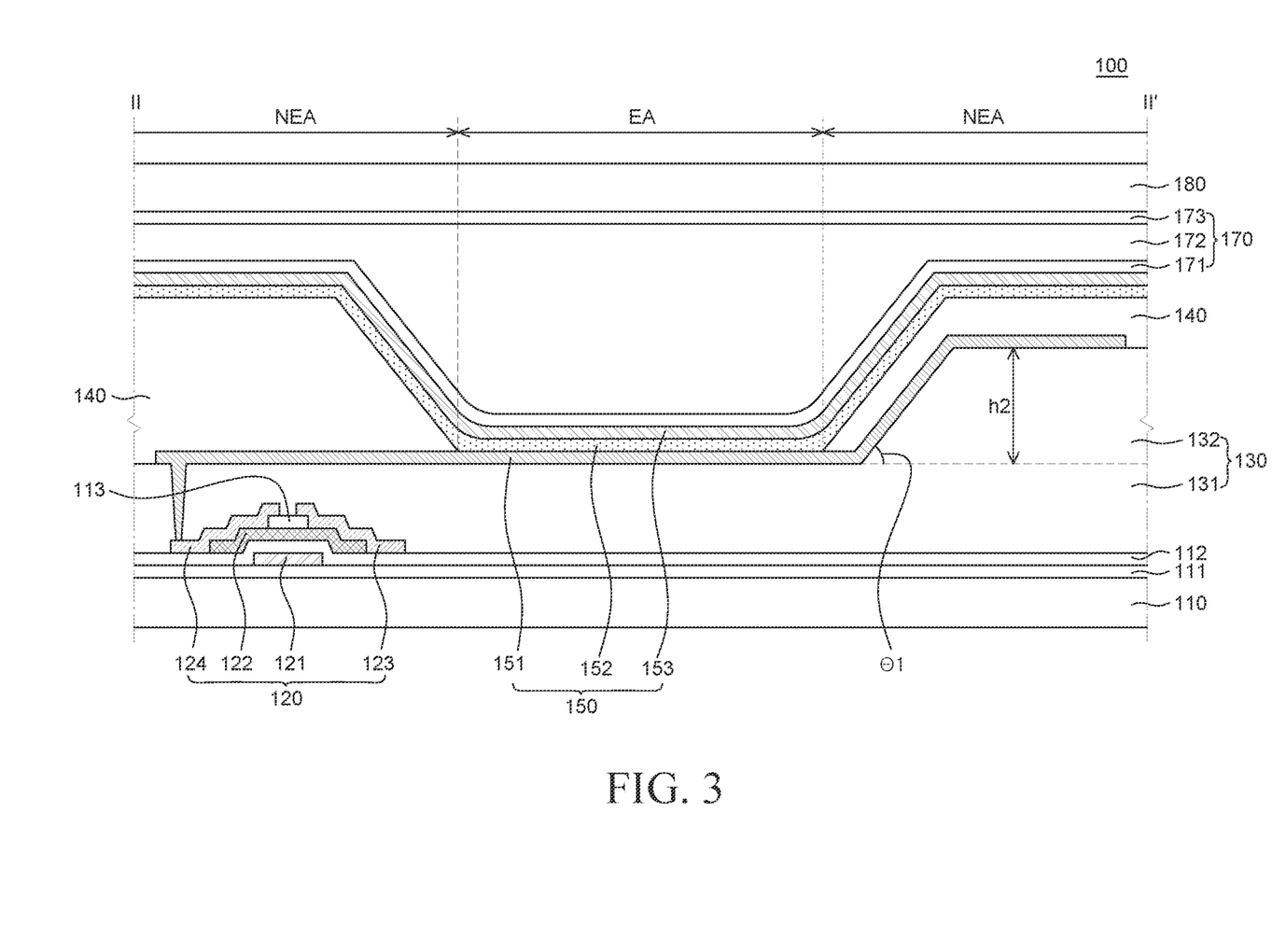
FIG. 3 is a cross-sectional view of the light emitting display apparatus taken along the line II-II' of FIG. 1.

Particularly, FIG. 3 is a cross-sectional view of the light emitting display apparatus taken along the line II-II' of FIG. 1. Even though the cover member 180 has a curved surface shape in the curved surface area CA, the size of one sub pixel SP is very small so that in FIG. 3, it is illustrated that the cover member 180 of the curved surface area CA has a flat surface shape, rather than a curved surface shape. Further, for the sake of brevity, the discussion of FIG. 3 will be focused on the differences between the structure of the second subpixel SP2 in comparison to the structure of the first subpixel SP1 which has been described in detail above.

Referring to FIGS. 1 and 3, the second sub pixel SP2 can be disposed on a portion of the substrate 110 corresponding to the curved surface area CA of the cover member 180.

Referring to FIG. 3, the protruding portion 132 disposed on the portion of the substrate 110 corresponding to the curved surface area CA of the cover member 180 can be disposed on one of both sides of the emission area EA. One side (also referred to as a first side) of the emission area EA of the second sub pixel SP2 is a side surface of the emission area EA which is farther from the flat surface area PA of the cover member 180, and the other side (also referred to as a second side) of the emission area EA of the second sub pixel SP2 is closer to the flat surface area PA than the first side. The first and second sides of the emission area EA are opposite sides.

For example, the protruding portion 132 disposed in the second sub pixel SP2 can be disposed at only one side which is farther from the flat surface area PA, among the two sides of the emission area EA. That is, the over coating layer 130 in FIG. 3 includes a base portion 131 and a protruding portion 132 protruding therefrom at only one side (the first side) of the emission area EA, but the protruding portion 132 is not present on the other side (the second side) of the emission area EA. Only the base portion 131 is disposed on the second side of the emission area EA of the second sub pixel SP2.

A height h2 of the protruding portion 132 disposed on one side (e.g., the first side) of the emission area EA of the second sub pixel SP2 can be equal to or higher than the height h1 of the protruding portion 132 of the first sub pixel SP1 disposed in the flat surface area PA. The more the slope of the curved surface area CA, the higher the height h2 of the protruding portion 132 of the second sub pixel SP2 can be. For example, as an angle formed by the flat surface area PA and the curved surface area CA of the cover member 180 is increased, the height h2 of the protruding portion 132 of the second sub pixel SP2 can be increased. For example, the height h2 of the protruding portion 132 of the second sub pixel SP2 can be 1 μm to 10 μm. However, it is not limited thereto and the height can vary depending on an angle formed by the flat surface area PA and the curved surface area CA of the cover member 180.

The angle formed by the side surface of the protruding portion 132 and the upper surface of the base portion 131 in the second sub pixel SP2, for example, a side surface slope angle of the protruding portion 132 in the second sub pixel SP2, can be referred to herein as a first angle θ1. For example, the side surface of the protruding portion 132 can be disposed on the base portion 131 at the first angle θ1. The first angle θ1 can be 40° to 80°, and more desirably, 45° to 65°, but is not limited thereto. Further, the side surface slope angle of the protruding portion 132 in the second sub pixel SP2 can be equal to (or greater than) the side surface slope angle of the protruding portion 132 in the first sub pixel SP1.

The first electrode 151 is disposed on the over coating layer 130 to cover the base portion 131 and a side portion and an upper portion of the protruding portion 132. Therefore, the first electrode 151 of the second sub pixel SP2 is disposed in accordance with the shape of the protruding portion 132 of the over coating layer 130 on one side (e.g., the first side) of the emission area EA so that the first electrode 151 can have an inclined upper surface on the side surface of the protruding portion 132. Further, the first electrode 151 of the second sub pixel SP2 can have a flat upper surface corresponding to the upper surface of the base portion 131 of the over coating layer 130 in the emission area EA and the other side (e.g., the second side) of the emission area EA. For instance, the first electrode 151 is directly disposed on the base portion 131 in one of the non-emission areas NEA (adjacent to the second side of the emission area EA), while the first electrode 151 is directly disposed on the protruding portion 132 in another one of the non-emission areas NEA adjacent to the first side of the emission area EA. In the example of FIG. 3, the first side of the emission area EA is the right side, while the second side of the emission area EA is the left side.

Hereinafter, the third sub pixel SP3 disposed on a portion of the substrate 110 corresponding to the curved surface area CA of the cover member 180 will be described in more detail with reference to FIG. 4 together. Further, for the sake of brevity, the discussion of FIG. 4 will be focused on the differences between the structure of the third subpixel SP2 in comparison to the structure of the second subpixel SP1 which has been described in detail above.

Figure 4:
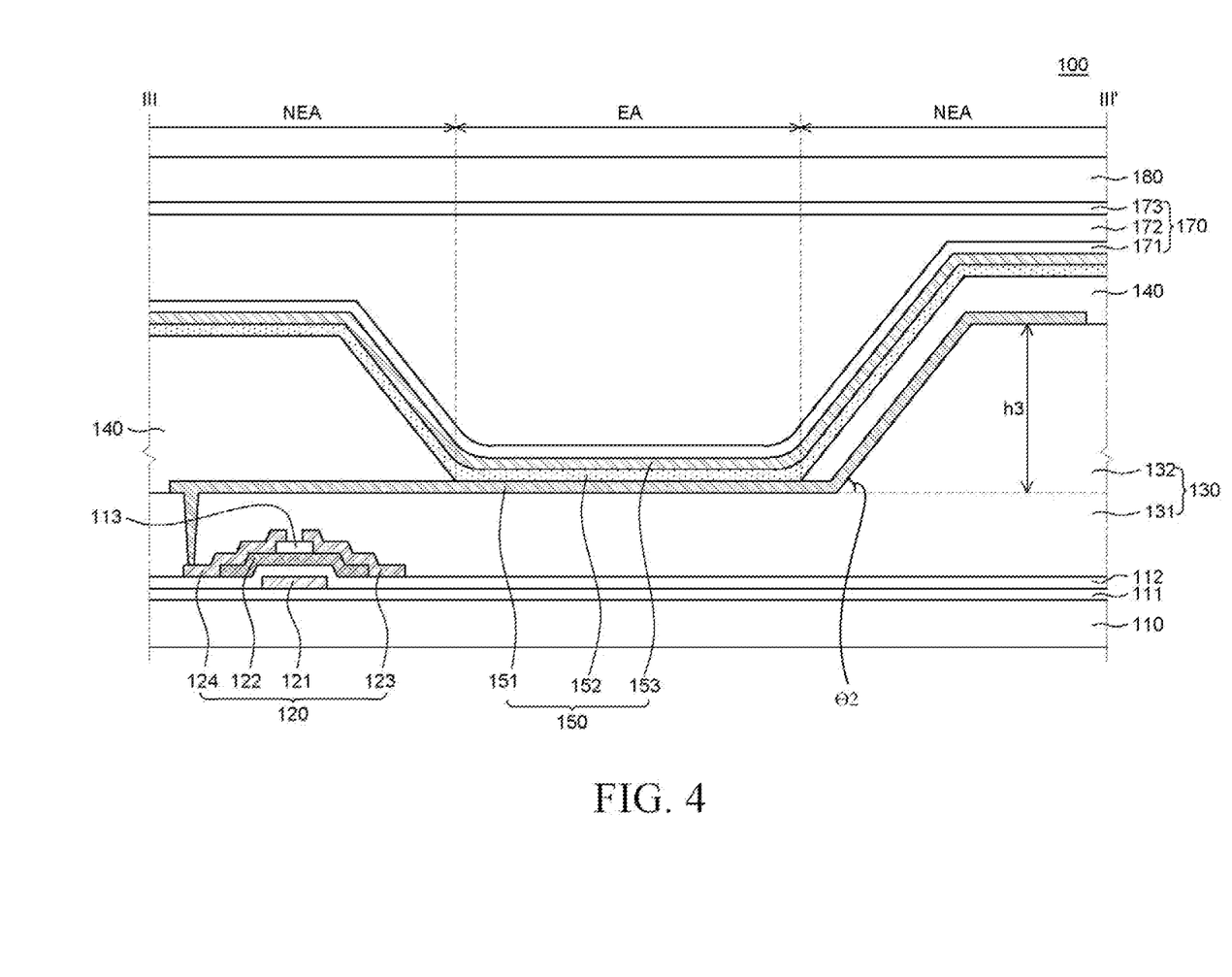
FIG. 4 is a cross-sectional view of the light emitting display apparatus taken along the line of FIG. 1.

Particularly, FIG. 4 is a cross-sectional view of the light emitting display apparatus taken along the line III-III' of FIG. 1. Even though the cover member 180 has a curved surface shape in the curved surface area CA, a size of one sub pixel SP is very small so that in FIG. 4, it is illustrated that the cover member 180 of the curved surface area CA has a flat surface shape, rather than a curved surface shape.

Referring to FIGS. 1 and 4, the plurality of sub pixels SP includes a third sub pixel SP3. The third sub pixel SP3 can be disposed on a portion of the substrate 110 corresponding to the curved surface area CA of the cover member 180. The third sub pixel SP3 can be disposed on the substrate 110 corresponding to a curved surface area CA farther from the flat surface area PA than the second sub pixel SP2. For example, the third sub pixel SP3 can be disposed to be farther from the flat surface area PA than the second sub pixel SP2. For example, a slope angle of the curved surface area CA corresponding to a position of the third sub pixel SP3 can be larger than a slope angle of the curved surface area CA corresponding to a position of the second sub pixel SP2. The third sub pixel SP3 can be disposed at the outside of the substrate 110 more than the second sub pixel SP2.

The protruding portion 132 of the third sub pixel SP3 can be disposed on one side of both sides of the emission area EA. One side (also referred to herein as a first side) of the emission area EA of the third sub pixel SP3 is a side surface of the emission area EA which is farther from the flat surface area PA of the cover member 180, and the other side (also referred to herein as a second side) of the emission area EA of the third sub pixel SP3 is closer to the flat surface area PA than the first side and is opposite to the first side of the emission area EA of the third sub pixel SP3. The protruding portion 132 of the third sub pixel SP3 can be disposed in only one side (e.g., the first side of the emission area EA of the third subpixel SP3) which is farther from the flat surface area PA, among the two sides of the emission area EA. Therefore, the third sub pixel SP3 includes a base portion 131 and a protruding portion 132 protruding therefrom at one side of the emission area EA (e.g., the first side of the emission area EA of the third subpixel SP3), while no protruding portion 132 exists on the second side of the emission area EA of the third subpixel SP3. On the second side of the emission area EA of the third subpixel SP3, only the base portion 131 (and not the protruding portion 132) of the over coating layer 130 is present.

As the distance from the flat surface area PA is increased, the heights h2 and h3 of the protruding portions 132 disposed in the plurality of sub pixels SP in the curved surface area CA can be increased. For example, a height h3 of the protruding portion 132 of the third sub pixel SP3 can be higher than the height h2 of the protruding portion 132 of the second sub pixel SP2.

A side surface slope angle of the protruding portion 132 in the third sub pixel SP3, which is also referred to herein as a second angle θ2, can be 40° to 80°. Further, the side surface slope angle of the protruding portion 132 in the third sub pixel SP3 can be equal to the side surface slope angle of the protruding portion 132 in the second sub pixel SP2. For instance, the second angle θ2 can be equal to the first angle θ1.

In recent years, in order to improve aesthetics, grip, and touch of the light emitting display apparatus, a product which uses an edge curved cover glass having a flat surface area and a curved surface area by processing an upper surface edge of the cover glass in a commercializing step is being developed. Specifically, when the light emitting display apparatus is implemented using the edge curved cover glass, the pixels are formed on a flat substrate. However, in the edge curved cover glass disposed above the pixels, a curved surface area is formed at the edge of the edge curved cover glass and the slope of the curved surface area is increased as a distance from the flat surface area is increased.

When the light emitting display apparatus is implemented using the edge curved cover glass, a path of light emitted to the outside of the light emitting display apparatus in the curved surface area can be different from that of the flat surface area due to the difference in a refractive index. Therefore, a difference in a color sense between the flat surface area and the curved surface area may be caused. For example, when it is assumed that white light is emitted from the light emitting display apparatus, white light is extracted from a front surface and the luminance is reduced as it is closer to the side surface so that bluish white light may be extracted and light traveling at a higher angle may be extracted as yellowish white light. In the flat surface area, the yellowish white light which travels at a higher angle is totally reflected from the cover glass to be extinct without being extracted to the outside. In contrast, in the curved surface area, the total reflection characteristic disappears so that yellowish white light is extracted to the outside. When a cover glass including only a flat surface area is used, the yellowish white light is not substantially emitted to the outside due to the total reflection so that a difference in a color sense between a center portion and an edge can be low. However, when the edge curved cover glass is used, as described above, the yellowish white light is emitted to the outside in the curved surface area so that differences in a luminance and a color sense between the flat surface area and the curved surface area may be significant.

Therefore, in the light emitting display apparatus 100 according to the exemplary embodiment of the present disclosure, the protruding portion 132 is asymmetrically formed in the sub pixel SP disposed to correspond to the curved surface area CA of the cover member 180 to adjust a light distribution in the curved surface area CA. For example, when the protruding portion 132 is formed only on one side surface which is far from the flat surface area PA, among both side surfaces of the emission area EA of the second sub pixel SP2 disposed to correspond to the curved surface area CA, some of light emitted from the light emitting layer 152 can be reflected by the first electrode 151 disposed on the side surface of the protruding portion 132. Therefore, some of the light emitted from the light emitting layer 152 is reflected by the first electrode 151 so that a traveling path of the light is changed. As a result, the light distribution of the light emitted from the light emitting layer 152 can be tilted toward the side surface direction of the light emitting display apparatus 100. Accordingly, in the light emitting display apparatus 100 according to the exemplary embodiment of the present disclosure, the light distribution of the light emitted from the light emitting layer 152 in the curved surface area CA is adjusted to be directed to the side surface direction of the light emitting display apparatus 100. By doing this, a degradation of the luminance in the curved surface area CA of the light emitting display apparatus 100 is improved, and the luminance irregularity and the color coordination variation problems between a flat surface area PA and a curved surface area CA can be solved or addressed effectively.

Further, in the light emitting display apparatus 100 according to the exemplary embodiment of the present disclosure, the height of the protruding portion 132 is adjusted in accordance with a slope of the curved surface area CA to adjust the light distribution in the curved surface area CA. For example, when the slope of the curved surface area CA is increased as the distance from the flat surface area PA is increased, the third sub pixel SP3 is disposed at the outside of the second sub pixel SP2. Further, the height h3 of the protruding portion 132 in the third sub pixel SP3 can be disposed to be higher than the height h2 of the protruding portion 132 in the second sub pixel SP2. Therefore, the light distribution in the third sub pixel SP3 can be tilted toward the side surface of the light emitting display apparatus 100 at a larger angle than the light distribution in the second sub pixel SP2. Accordingly, as the slope of the curved surface area CA of the cover member 180 is increased, the height of the protruding portion 132 is disposed to be higher so that the luminance irregularity and the color sense variation between the flat surface area PA and the curved surface area CA can be minimized.

Figure 5:
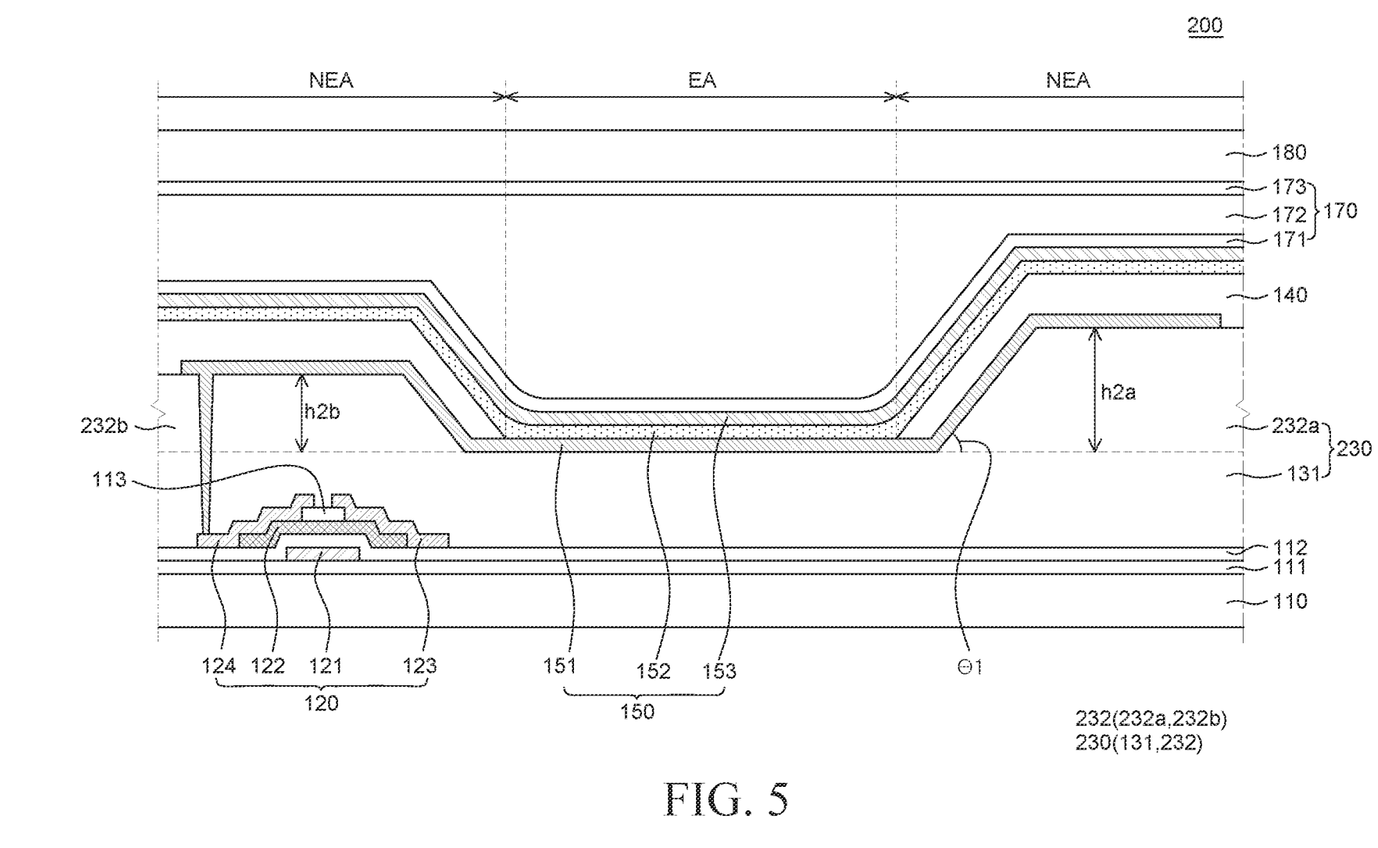
FIG. 5 is a cross-sectional view of a second sub pixel in a light emitting display apparatus according to another exemplary embodiment of the present disclosure.
Figure 6:
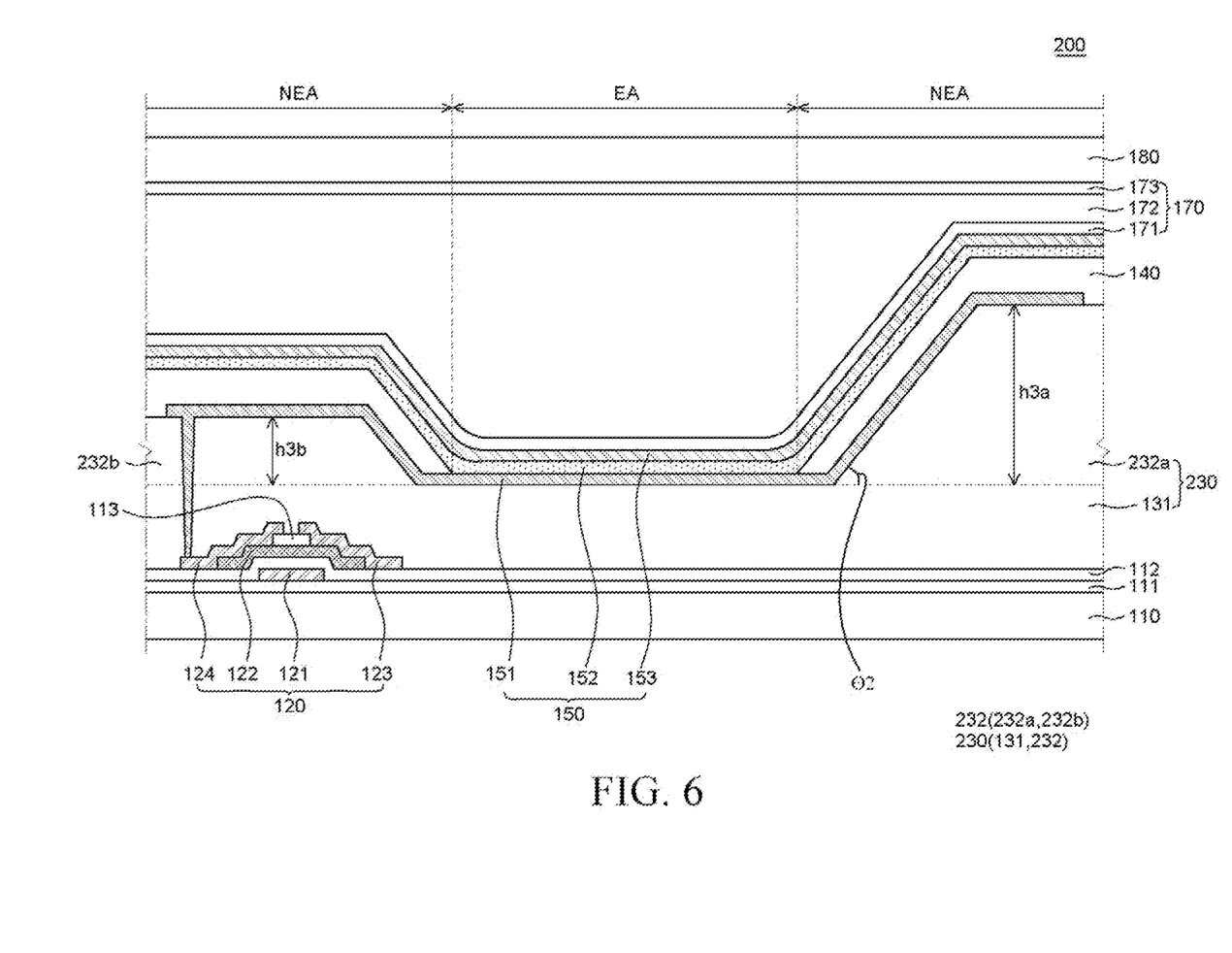
FIG. 6 is a cross-sectional view of a third sub pixel in a light emitting display apparatus according to another exemplary embodiment of the present disclosure.

FIG. 5 is a cross-sectional view of a second sub pixel (e.g., SP2) in a light emitting display apparatus according to another exemplary embodiment of the present disclosure. FIG. 6 is a cross-sectional view of a third sub pixel (e.g., SP3) in a light emitting display apparatus according to another exemplary embodiment of the present disclosure. As compared with the light emitting display apparatus 100 illustrated in FIGS. 1 to 4, in a light emitting display apparatus 200 according to another exemplary embodiment of the present disclosure illustrated in FIGS. 5 and 6, the components except for the shapes of an over coating layer 230 and the first electrode 151 in the curved surface area CA are the same or substantially the same. Therefore, a redundant description will be omitted or may be briefly provided.

Further, when the light emitting display apparatus 200 according to another exemplary embodiment of the present disclosure is described, for the convenience of description, the perspective view of the light emitting display apparatus illustrated in FIG. 1 and the cross-sectional view of the first sub pixel illustrated in FIG. 2 are referred together. Even though the cover member 180 has a curved surface shape in the curved surface area CA, a size of one sub pixel SP is very small so that in FIGS. 5 and 6, it is illustrated that the cover member 180 of the curved surface area CA has a flat surface shape, rather than a curved surface shape.

Referring to FIGS. 5 and 6, the light emitting display apparatus 200 according to another exemplary embodiment of the present disclosure includes a substrate 110, a thin film transistor 120, an over coating layer 230, a bank layer 140, a light emitting diode 150, an encapsulation unit 170, and a cover member 180.

As shown in FIG. 5, the second sub pixel SP2 in the light emitting display apparatus 200 can be disposed on a portion of the substrate 110 corresponding to the curved surface area CA of the cover member 180.

A protruding portion 232 in the second sub pixel SP2 can include a first protruding portion 232a and a second protruding portion 232b. The first protruding portion 232a and the second protruding portion 232b can be disposed on both sides of the emission area EA. For example, the first protruding portion 232a can be disposed on one side of the emission area EA, the second protruding portion 232b can be disposed on the other side of the emission area EA. At this time, the one side of the emission area EA in which the first protruding portion 232a is disposed is a side surface of the emission area EA that is farther from the flat surface area PA than the other side of the emission area EA in which the second protruding portion 232b is disposed. For example, the second protruding portion 232b can be disposed to be more adjacent to the flat surface area PA than the first protruding portion 232a. Therefore, the first protruding portion 232a can be disposed at the outside more than the second protruding portion 232b.

An angle formed by the side surface of the first protruding portion 232a and the side surface of the second protruding portion 232b, and the upper surface of the base portion 131 in the second sub pixel SP2, for example, a side surface slope angle of the first protruding portion 232a and a side surface slope angle of the second protruding portion 232b in the second sub pixel SP2 can each be a first angle θ1. For example, the side surface of the first protruding portion 232a and the side surface of the second protruding portion 232b can be disposed on the base portion 131 with the first angle θ1. The first angle θ1 can be 40° to 80° or 45° to 65°, but is not limited thereto. Further, the slope angle of the side surface of the first protruding portion 232a and the slope angle of the side surface of the second protruding portion 232b can be formed to be different. For example, the slope angle of the side surface of the first protruding portion 232a can be greater than the slope angle of the side surface of the second protruding portion 232b.

In the second sub pixel SP2, the first protruding portion 232a and the second protruding portion 232b can have different heights. For example, between the first protruding portion 232a and the second protruding portion 232b, a height h2a of the first protruding portion 232a which is disposed to be far from the flat surface area PA can be higher than the height h2b of the second protruding portion 232b. Therefore, the light distribution of the light emitting display apparatus 200 in the curved surface area CA can be tilted toward the side surface. For example, each of the height h2a of the first protruding portion 232a and the height h2b of the second protruding portion 232b in the second sub pixel SP2 can be selected in the range of 1 μm to 10 μm. At this time, the height h2a of the first protruding portion 232a can be higher than the height h2b of the second protruding portion 232b. For example, a ratio (h2b:h2a) of the height h2b of the second protruding portion 232b and the height h2a of the first protruding portion 232a in the second sub pixel SP2 can be 1:1.5 to 1:3. However, it is not limited thereto so that as long as the height h2a of the first protruding portion 232a is higher than the height h2b of the second protruding portion 232b, the ratio can vary in various ways.

The ratio h2b:h2a of the height h2b of the second protruding portion 232b and the height h2a of the first protruding portion 232a in the second sub pixel SP2 can increase as the slope of the curved surface area CA is increased. For example, the ratio can be increased as an angle formed by the flat surface area PA and the curved surface area CA of the cover member 180 is increased. As described with reference to FIGS. 1 to 4, the protruding portion can be disposed on only one side far from the flat surface area PA between both sides of the emission area EA in the curved surface area CA or the protruding portion is asymmetrically disposed by adjusting a height and a slope angle of the protruding portion disposed in one side far from the flat surface area PA. By doing this, if the light distribution is implemented to be tilted toward the side surface of the light emitting display apparatus, the height, the difference in the heights, and the height ratio of the protruding portion can vary in various ways.

In the second sub pixel SP2 of the light emitting display apparatus 200, the height h2b of the second protruding portion 232b in the second sub pixel SP2 can be equal to or lower than the height h1 of the protruding portion 132 in the first sub pixel SP1 of the light emitting display apparatus 200.

Hereinafter, a shape of the over coating layer 230 will be described in more detail with reference to FIG. 7 together. The over coating layer 230 in FIGS. 5 and 6 can have the configuration of the over coating layer 230 shown in FIG. 7 as a variation.

Figure 7:
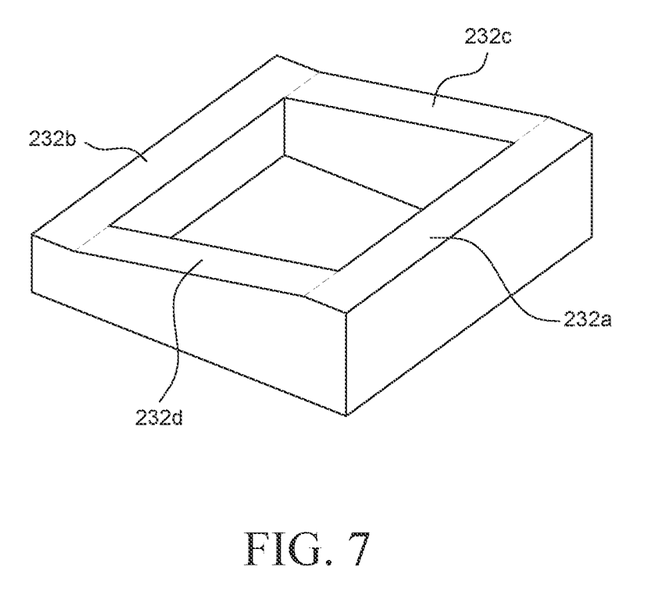
FIG. 7 is a perspective view of an over coating layer in a light emitting display apparatus according to another exemplary embodiment of the present disclosure.

FIG. 7 is a perspective view of an over coating layer in a light emitting display apparatus according to another exemplary embodiment of the present disclosure. In FIG. 7, for the convenience of description, only an over coating layer 230 which encloses one sub pixel SP is schematically illustrated.

Referring to FIG. 7, in a plurality of sub pixels SP2 and SP3 disposed to correspond to the curved surface area CA, the protruding portion 232 further includes a third protruding portion 232c and a fourth protruding portion 232d, in addition to the first and second protruding portions 232a and 232b. The third protruding portion 232c and the fourth protruding portion 232d are disposed between the first protruding portion 232a and the second protruding portion 232b to connect one side and the other side of the first protruding portion 232a and the second protruding portion 232b. At this time, the height h2a of the first protruding portion 232a is higher than the height h2b of the second protruding portion 232b so that the height of the third protruding portion 232c and the height of the fourth protruding portion 232d can be increased toward the first protruding portion 232a from the second protruding portion 232b. For example, the heights of the third protruding portion 232c and the height of the fourth protruding portion 232d can be increased toward the first protruding portion 232a. Therefore, the first protruding portion 232a, the second protruding portion 232b, the third protruding portion 232c, and the fourth protruding portion 232d can be disposed to enclose the emission area EA of the second sub pixel SP2.

Returning to FIG. 5, the first electrode 151 is disposed on the over coating layer 230 to cover the base portion 131 and a side portion and an upper portion of the protruding portion 232 (including the first and second protruding portions 232a and 232b). For example, the first electrode 151 is disposed on the upper surface of the base portion 131 where the protruding portion 232 is not disposed, and on the side surface and a partial area of the upper surface of the protruding portion 232. The first electrode 151 is disposed in accordance with the shape of the base portion 131 and the protruding portion 232. Therefore, in the second sub pixel SP2, the first electrode 151 has a flat upper surface on the upper surface of the base portion 131 and the upper surface of the protruding portion 232 of the over coating layer 230 and has an inclined upper surface on the side surface of the protruding portion 232.

The third sub pixel SP3 of the light emitting display apparatus 200 will be described in detail with reference to FIG. 6. The third sub pixel SP3 illustrated in FIG. 6 has a different shape of the over coating layer 230 from that of the second sub pixel SP2 illustrated in FIG. 5 and a redundant description will be omitted or may be briefly provided.

Referring to FIG. 6, the plurality of sub pixels includes the third sub pixel SP3. The third sub pixel SP3 can be disposed on a portion of the substrate 110 corresponding to the curved surface area CA of the cover member 180. Further, the third sub pixel SP3 can be disposed on the substrate 110 corresponding to a curved surface area CA farther from the flat surface area PA than the second sub pixel SP2. For example, the third sub pixel SP3 can be disposed to be farther from the flat surface area PA than the second sub pixel SP2. For example, a slope angle of the curved surface area CA corresponding to a position of the third sub pixel SP3 can be larger than a slope angle of the curved surface area CA corresponding to a position of the second sub pixel SP2. The third sub pixel SP3 can be disposed at the outside of the substrate 110 more than the second sub pixel SP2.

The third sub pixel SP3 can include a first protruding portion 232a and a second protruding portion 232b. In the third sub pixel SP3, the first protruding portion 232a and the second protruding portion 232b can be disposed on both sides of the emission area EA. For example, the first protruding portion 232a can be disposed on one side of the emission area EA and the second protruding portion 232b can be disposed on the other side of the emission area EA. At this time, one side of the emission area EA in which the first protruding portion 232a is disposed is a side surface of the emission area EA farther from the flat surface area PA than the other side of the emission area EA in which the second protruding portion 232b is disposed. For example, the second protruding portion 232b can be disposed to be more adjacent to the flat surface area PA than the first protruding portion 232a. Therefore, the first protruding portion 232a can be disposed at the outside more than the second protruding portion 232b.

In the third sub pixel SP3, the first protruding portion 232a and the second protruding portion 232b can have different heights. For example, between the first protruding portion 232a and the second protruding portion 232b, a height h3a of the first protruding portion 232a which is disposed to be far from the flat surface area PA can be higher than a height h3b of the second protruding portion 232b. Further, the height h3a of the first protruding portion 232a of the third sub pixel SP3 can be higher than a height h2a of the first protruding portion 232a of the second sub pixel SP2. For example, the farther from the flat surface area PA, the higher the heights h2a and h3a of the first protruding portions 132a disposed in the plurality of sub pixels SP in the curved surface area CA. Therefore, the farther from the flat surface area PA, the higher the heights h2a and h3a of the first protruding portions 232a disposed in the plurality of sub pixels SP. Therefore, the light distribution of the light emitting display apparatus 200 in the curved surface area CA can be tilted toward the side surface.

The slope of the curved surface area CA in which the third sub pixel SP3 is located can be larger than the slope of the curved surface area CA in which the second sub pixel SP2 is located. Therefore, a ratio h3b:h3a of the height h3b of the second protruding portion 232b to the height h3a of the first protruding portion 232a in the third sub pixel SP3 can be larger than a ratio h2b:h2a of the height h2b of the second protruding portion 232b to the height h2a of the first protruding portion 232a in the second sub pixel SP2. Therefore, the light distribution of the light emitting display apparatus 200 in the curved surface area CA is tilted toward the side surface so that the luminance degradation and the color coordinate variation issues in the curved surface area CA can be addressed. For example, when the ratio h2b:h2a of the height h2b of the second protruding portion 232b to the height h2a of the first protruding portion 232a in the second sub pixel SP2 is 1:1.5, the ratio h3b:h3a of the height h3b of the second protruding portion 232b to the height h3a of the first protruding portion 232a in the third sub pixel SP3 can be 1:2. However, it is not limited thereto and the ratio can vary in various ways depending on the slope of the curved surface area.

Further, a side surface slope angle of the protruding portion 232a in the third sub pixel SP3, which is also referred to herein as a second angle θ2, can be 40° to 80°. In a variation, the side surface slope angle of the protruding portion 232a in the third sub pixel SP3 can be equal to the side surface slope angle of the protruding portion 232a in the second sub pixel SP2. For instance, the second angle θ2 can be equal to the first angle θ1 in FIGS. 5 and 6.

The exemplary embodiments of the present disclosure can also be described as follows:

According to an aspect of the present disclosure, a light emitting display apparatus comprising a cover member including a flat surface area and a curved surface area, and a display panel disposed below the cover member, wherein the display panel includes a substrate in which a plurality of sub pixels is disposed, an over coating layer which is disposed on the substrate and includes a base portion and a protruding portion protruding from the base portion, a plurality of first electrodes disposed to cover a side portion of the protruding portion and the base portion, a bank layer which is disposed on some of the plurality of first electrodes in a non-emission area to define an emission area and the non-emission area of the plurality of sub pixels, a light emitting layer disposed on the plurality of first electrodes and the bank layer and a second electrode disposed on the light emitting layer, the plurality of sub pixels includes a first sub pixel disposed on the substrate corresponding to the flat surface area and a second sub pixel disposed on the substrate corresponding to the curved surface area, and the protruding portion is disposed on one side farther from the flat surface area, between both sides of the emission area of the second sub pixel.

A slope of the curved surface area can be increased as a distance from the flat surface area is increased.

The protruding portion can be disposed on both sides of the emission area of the first sub pixel with the same height.

The protruding portion disposed in the second sub pixel can include a first protruding portion disposed on one side of the emission area and a second protruding portion which has a height lower than that of the first protruding portion and is disposed on the other side of the emission area, and the second protruding portion can be disposed to be closer to the flat surface area than the first protruding portion.

A ratio of the height of the second protruding portion to the height of the first protruding portion can be 1:1.5 to 1:3.

The protruding portion disposed in the second sub pixel can be further include a third protruding portion and a fourth protruding portion which connect the first protruding portion and the second protruding portion, and heights of the third protruding portion and the fourth protruding portion can be increase toward the first protruding portion.

The first protruding portion to the fourth protruding portion can be disposed to enclose the emission area.

A height of the first protruding portion can be increase as the distance from the flat surface area is increased.

A difference between the height of the first protruding portion and the height of the second protruding portion can be increase as an angle formed by the flat surface area and the curved surface area is increased.

The plurality of sub pixels can include a third sub pixel which is disposed on the substrate corresponding to the curved surface area and can be disposed to be farther from the flat surface area than the second sub pixel, and a protruding portion disposed in the third sub pixel can be disposed on one side farther from the flat surface area between both sides of an emission area of the third sub pixel, and can have a height higher than a height of a protruding portion disposed in the second sub pixel.

The protruding portion disposed in the second sub pixel can be include a first protruding portion disposed in one side of the emission area and a second protruding portion which has a lower height than the first protruding portion and is disposed on the other side of the emission area, the protruding portion disposed in the third sub pixel can include a first protruding portion disposed in one side of the emission area and a second protruding portion which has a lower height than the first protruding portion and is disposed on the other side of the emission area, and the height of the first protruding portion of the third sub pixel can be higher than the height of the first protruding portion of the second sub pixel.

A slope angle of the curved surface area corresponding to the third sub pixel can be larger than a slope angle of the curved surface area corresponding to the second sub pixel.

An upper surface and a lower surface of the display panel have flat surfaces and a lower surface of the cover member can be flat, and an upper surface of the cover member corresponding to the curved surface area can have a curved surface structure.

According to another aspect of the present disclosure, a light emitting display apparatus comprising a cover member including a flat surface area and a curved surface area, and a display panel which is disposed below the cover member and has a flat structure, wherein the display panel includes a substrate in which a plurality of sub pixels including an emission area and a non-emission area is disposed, an over coating layer which is disposed on the substrate and includes a base portion and a protruding portion, and a plurality of light emitting diodes which is disposed in each of the plurality of sub pixels on the over coating layer and includes a first electrode, a light emitting layer, and a second electrode, protruding portions disposed in the plurality of sub pixels corresponding to the flat surface area among the plurality of sub pixels are disposed on both sides of the emission area with the same height, wherein a protruding portion disposed in the plurality of sub pixels corresponding to the curved surface area, among the plurality of sub pixels, includes a first protruding portion which is disposed on one side farther from the flat surface area between both sides of the emission area to adjust a light distribution in the curved surface area, and a second protruding portion which has a lower height than the first protruding portion and is disposed on the other side of the emission area.

A ratio of the height of the second protruding portion to the height of the first protruding portion can be 1:1.5 to 1:3.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A light emitting display apparatus, comprising:
   a display panel including a plurality of sub pixels; and
   a cover member including a flat surface area and a curved surface area, and covering the display panel,
   wherein the display panel includes:
   a substrate in which the plurality of sub pixels is disposed;
   an over coating layer disposed on the substrate, and including a base portion and a protruding portion protruding from the base portion;
   a plurality of first electrodes included in a plurality of sub pixels, and disposed to cover the base portion and a side portion of the protruding portion;

a bank layer disposed on some of the plurality of first electrodes in non-emission areas to define an emission area and a non-emission area for each of the plurality of sub pixels;

a light emitting layer included in the plurality of sub pixels, and disposed on the plurality of first electrodes and the bank layer; and a second electrode included in the plurality of sub pixels, and disposed on the light emitting layer, wherein the plurality of sub pixels include a first sub pixel disposed on the substrate corresponding to the flat surface area of the cover member and a second sub pixel disposed on the substrate corresponding to the curved surface area of the cover member, the protruding portion of the over coating layer is disposed on a first side of an emission area of the second subpixel, the first side being farther from the flat surface area of the cover member than a second side of the emission area of the second sub pixel, an entire upper surface and an entire lower surface of the display panel are each flat, an entire lower surface of the cover member is flat, an upper surface of the cover member corresponding to the curved surface area of the cover member has a curved surface structure, and the protruding portion does not overlap the emission area, and the first electrode is disposed parallel to an upper surface of the base portion in the emission area.

2. The light emitting display apparatus according to claim 1, wherein a slope of the curved surface area of the cover member increases as a distance from the flat surface area increases.

3. The light emitting display apparatus according to claim 1, wherein the protruding portion of the over coating layer is disposed on two opposite sides of the emission area of the first sub pixel, with a same height.

4. The light emitting display apparatus according to claim 1, wherein the protruding portion disposed in the second sub pixel includes:

a first protruding portion disposed on the first side of the emission area of the second sub pixel, and a second protruding portion having a height lower than a height of the first protruding portion, and disposed on the second side of the emission area of the second sub pixel, and wherein the second protruding portion is disposed to be closer to the flat surface area of the cover member than the first protruding portion.

5. The light emitting display apparatus according to claim 4, wherein a ratio of the height of the second protruding portion to the height of the first protruding portion is approximately 1:1.5 to approximately 1:3.

6. The light emitting display apparatus according to claim 4, wherein the protruding portion disposed in the second sub pixel further includes a third protruding portion and a fourth protruding portion which connect the first protruding portion and the second protruding portion, and heights of the third protruding portion and the fourth protruding portion increase toward the first protruding portion.

7. The light emitting display apparatus according to claim 6, wherein the first protruding portion to the fourth protruding portion are disposed to enclose the emission area of the second sub pixel.

8. The light emitting display apparatus according to claim 4, wherein the height of the first protruding portion increases as a distance from the flat surface area increases.

9. The light emitting display apparatus according to claim 4, wherein a difference between the height of the first protruding portion and the height of the second protruding portion increases as an angle formed by the flat surface area and the curved surface area increases.

10. The light emitting display apparatus according to claim 1, wherein the plurality of sub pixels further includes a third sub pixel disposed on the substrate corresponding to the curved surface area of the cover member, the third sub pixel is disposed to be farther from the flat surface area than the second sub pixel, the protruding portion in the third sub pixel is disposed on one side farther from the flat surface area among two sides of an emission area of the third sub pixel, and the protrusion portion in the third sub pixel has a height greater than a height of the protruding portion disposed in the second sub pixel.

11. The light emitting display apparatus according to claim 10, wherein the protruding portion disposed in the second sub pixel includes:

a first protruding portion disposed in the first side of the emission area of the second sub pixel; and a second protruding portion having a lower height than the first protruding portion in the second sub pixel, and disposed on the second side of the emission area of the second sub-pixel, wherein the protruding portion disposed in the third sub pixel includes:

a first protruding portion disposed in one side of the emission area of the third sub pixel; and a second protruding portion having a lower height than the first protruding portion of the third sub pixel, and disposed on another side of the emission area of the third sub pixel, and wherein the height of the first protruding portion of the third sub pixel is higher than the height of the first protruding portion of the second sub pixel.

12. The light emitting display apparatus according to claim 11, wherein a slope angle of the curved surface area corresponding to the third sub pixel is larger than a slope angle of the curved surface area corresponding to the second sub pixel.

* * * * *